(12) United States Patent
Gadinski et al.

(10) Patent No.: US 11,548,114 B1
(45) Date of Patent: Jan. 10, 2023

(54) COMPRESSIBLE NON-RETICULATED POLYUREA POLISHING PAD

(71) Applicant: Rohm and Haas Electronic Materials CMP Holdings, Inc., Newark, DE (US)

(72) Inventors: Matthew R. Gadinski, Newark, DE (US); Joseph So, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 17/472,609

(22) Filed: Sep. 11, 2021

(51) Int. Cl.
| | |
|---|---|
| B24B 37/24 | (2012.01) |
| H01L 21/304 | (2006.01) |
| B24B 37/26 | (2012.01) |
| C08L 75/04 | (2006.01) |
| C09K 3/14 | (2006.01) |
| C09G 1/02 | (2006.01) |

(52) U.S. Cl.
CPC .............. *B24B 37/24* (2013.01); *B24B 37/26* (2013.01); *H01L 21/304* (2013.01); *C08L 75/04* (2013.01); *C09G 1/02* (2013.01); *C09K 3/14* (2013.01)

(58) Field of Classification Search
CPC ..................................................... B24B 37/24
See application file for complete search history.

(56) References Cited

U.S. PATENT DOCUMENTS

| | | |
|---|---|---|
| 5,332,798 A | 7/1994 | Ferreri et al. |
| 9,056,382 B2 | 6/2015 | Litke et al. |
| 11,179,822 B2 | 11/2021 | Zhu et al. |
| 2005/0042976 A1* | 2/2005 | Ronay ................... B24B 37/24 451/41 |
| 2008/0014841 A1 | 1/2008 | Ronay |
| 2021/0094144 A1 | 4/2021 | Ahn et al. |

FOREIGN PATENT DOCUMENTS

JP        2017074649        4/2017

OTHER PUBLICATIONS

Tonelli et al., "New Fluorinated Thermoplastic Elastomers", Journal of Applied Polymer Science, 1996, vol. 59, 311-327.
Tonelli et al., "New Fluoro-Modified Thermoplastic Polyurethanes", Journal of Applied Polymer Science, 2003, vol. 87, 2279-2294.
Copending U.S. Appl. No. 17/472,607.
Copending U.S. Appl. No. 17/472,610.

* cited by examiner

*Primary Examiner* — Alexandra M Moore
(74) *Attorney, Agent, or Firm* — Blake T. Biederman

(57) ABSTRACT

The invention provides a polishing pad suitable for polishing at least one of semiconductor, optical, magnetic or electromechanical substrates. It includes a polyurea polishing layer and a polyurea matrix. The polyurea has a soft segment being a copolymer of aliphatic fluorine-free polymer groups and a fluorocarbon having a length of a least six carbons. The polyurea matrix being cured with a curative agent and including gas or liquid-filled polymeric microelements. The polyurea matrix has a bulk region and a transition region adjacent the bulk region that extends to the polishing layer. The polymeric microelements in the transition region decrease in thickness as they approach the polishing layer with thickness of the compressed microelements adjacent the polishing layer being less than fifty percent of a diameter of the polymeric microelements in the bulk region. The polishing layer remains hydrophilic during polishing in shear conditions.

10 Claims, 6 Drawing Sheets

COMPRESSIBLE NON-RETICULATED POLYUREA POLISHING PAD

BACKGROUND OF THE INVENTION

Chemical Mechanical Planarization (CMP) is a variation of a polishing process that is widely used to flatten, or planarize, the layers of construction of an integrated circuit in order to precisely build multilayer-three-dimensional circuitry. The layer to be polished is typically a thin film (less than 10,000 Angstroms) that has been deposited on an underlying substrate. The objectives of CMP are to remove excess material on the wafer surface to produce an extremely flat layer of a uniform thickness, the uniformity extending across the entire wafer area. Control of removal rate and the uniformity of removal are of paramount importance.

CMP utilizes a liquid, often called slurry, which contains nano-sized particles. This is fed onto the surface of a rotating multilayer polymer sheet, or pad, which is mounted on a rotating platen. Wafers are mounted into a separate fixture, or carrier, which has a separate means of rotation, and pressed against the surface of the pad under a controlled load. This leads to a high rate of relative motion between the wafer and the polishing pad (i.e., there is a high rate of shear at both the substrate and the pad surface. Slurry particles trapped at the pad/wafer junction abrade the wafer surface, leading to removal. In order to control rate, prevent hydroplaning, and to efficiently convey slurry under the wafer, various types of texture are incorporated into the upper surface of the polishing pad. Fine scale texture is produced by abrading the pad with an array of fine diamonds. This is done to control and increase removal rate, and is commonly referred to as conditioning. Larger scale grooves of various patterns and dimensions (e.g., XY, circular, radial) are also incorporated for hydrodynamic and slurry transport regulation.

Removal rate during CMP is widely observed to follow the Preston Equation, Rate=$K_p*P*V$, where P is pressure, V is velocity, and $K_p$ is the so-called Preston Coefficient. The Preston Coefficient is a lumped sum constant that is characteristic of the consumable set being used. Several of the most important effects contributing to $K_p$ are as follows: (a) pad contact area (largely derived from pad texture and surface mechanical properties); (b) the concentration of slurry particles on the contact area surface available to do work; and (c) the reaction rate between the surface particles and the surface of the layer to be polished. Effect (a) is largely determined by pad properties and the conditioning process. Effect (b) is determined by both pad and slurry, while effect (c) is largely determined by slurry properties.

The advent of high capacity multiple layer memory devices (e.g., 3D NAND flash memory) has led to a need for further increases in removal rate. The critical part of the 3D NAND manufacturing process consists of building up multilayer stacks of $SiO_2$ and $Si_3N_4$ films in an alternating fashion in a pyramidal staircase fashion. Once completed, the stack is capped with a thick $SiO_2$ overlayer, which must be planarized prior to completion of the device structure. This thick film is commonly referred to as the Pre-Metal Dielectric (PMD). The device capacity is proportional to the number of layers in the layered stack. Current commercial devices use 32 and 64 layers, and the industry is rapidly moving to 128 layers. The thickness of each oxide/nitride pair in the stack is ~125 nm. Thus, the thickness of the stack increases directly with the number of layers (32=4,000 nm, 64=8,000 nm, 128=16,000 nm). For the PMD step, the total amount of capping dielectric to be removed is approximately equal to approximately 1.5 times the stack thickness, assuming a conformal deposition of the PMD.

Conventional dielectric CMP slurries have removal rates of ~250 nm/min. This yields undesirably lengthy CMP process times for the PMD step, which now is the primary bottleneck in the 3D NAND manufacturing process. Consequently, there has been much work on developing faster CMP processes. Most improvements have focused on process conditions (higher P and V), changing the pad conditioning process, and improvements in slurry design, particularly in $CeO_2$-based slurries. If an improved pad could be developed that can be paired with the existing processes and $CeO_2$ slurries to achieve higher removal rate without introducing any negative effects, it would constitute a significant improvement in CMP technology.

The most commonly used top pad layer used in dielectric CMP is the IC1000™ polyurethane polishing pad. This pad has many desirable properties, including its surface charge in water. As shown in an article by Sokolov et al (J. Colloid Interface Sci, 300 (2), p. 475-81, 2006) the surface charge of IC1000™ polishing pads is increasingly negative for pH values above 2. Since polishing pads in motion during polishing, the physical properties of the pad asperities under shear are critically important.

The primary methods used to achieve increased rate in CMP pads are the following: i) optimization of groove design without changing the composition of the top pad layer; ii) altering the conditioning process without changing the composition of the top pad layer; iii) providing pads with more desirable conditioning response by changing the conditioning response of the top pad layer; and iv) providing pads with top pad layers having higher hardness or modified elastic properties.

Hattori et al (Proc. ISET07, p. 953-4 (2007)) discloses comparative zeta potential vs. pH plots for various lanthanide particle dispersions, including $CeO_2$. The pH of zero charge or isoelectric point was measured as approximately 6.6. Below this pH, the particle has a positive potential; above this pH the particle has a negative potential. The isoelectric point can shift for different ceria particles or with modification of the ceria-containing slurry.

With the development of 3D NAND, there is an increased desire for polishing pads with increased ceria polishing rate.

STATEMENT OF THE INVENTION

An embodiment of the invention provides a polishing pad suitable for polishing at least one of semiconductor, optical, magnetic or electromechanical substrates comprising: a polyurea polishing layer, the polyurea polishing layer including a polyurea matrix, the polyurea having a soft segment and a hard segment, the soft segment being a copolymer of aliphatic fluorine-free polymer groups and a fluorocarbon having a length of a least six carbons, the polyurea matrix being cured with a curative agent and including gas or liquid-filled polymeric microelements, the polyurea matrix being having a bulk region, a transition region adjacent the bulk region that extends to the polishing layer, the polymeric microelements having a diameter and being spherical in the bulk region of the polyurea matrix, the polymeric microelements in the transition region having decreased thickness as it approaches the polishing layer with thickness of the compressed microelements adjacent the polishing layer being less than fifty percent of the diameter of the polymeric microelements in the bulk region and the polymeric microspheres being fractured at the polishing layer during polishing wherein the polishing layer remains hydrophilic during polishing in shear conditions.

Another embodiment of the invention provides A polishing pad suitable for polishing at least one of semiconductor, optical, magnetic or electromechanical substrates comprising: a polyurea polishing layer, the polyurea polishing layer including a polyurea matrix, the polyurea having a soft segment and a hard segment, the soft segment being a copolymer of aliphatic fluorine-free polymer groups and a fluorocarbon having a length of a least six carbons, the polyurea matrix being cured with a curative agent and including gas or liquid-filled polymeric microelements, the polyurea matrix being having a bulk region, a transition region adjacent the bulk region that extends to the polishing layer, the polymeric microelements having a diameter and being spherical in the bulk region of the polyurea matrix, the polymeric microelements in the transition region having decreased thickness as it approaches the polishing layer with thickness of the compressed microelements adjacent the polishing layer being less than fifty percent of the diameter of the polymeric microelements in the bulk region wherein at least of a portion of the polymeric microelements adjacent the polishing layer form channels that interconnect adjacent and the polymeric microspheres being fractured at the polishing layer during polishing wherein the polishing layer remains hydrophilic during polishing in shear conditions.

DETAILED DESCRIPTION OF THE INVENTION

The polishing pad of the invention is suitable for polishing at least one of semiconductor, optical, magnetic or electromechanical substrates. The key element of the present invention is the modification of the top pad surface properties to facilitate ceria slurry or other particles above their isoelectric point for polishing with the upper surface or polishing layer. In particular, the invention provides an increase in the effectiveness or efficiency ceria slurry particles on the upper surface, increases the polishing rate. An unexpected and novel effect in pads of the present invention is that the addition of fluorine-containing copolymers in relatively low concentration (approximately 1-20 wt % of the total soft segment concentration) into the soft segment of a urethane block copolymer yields improved removal rate. For purposes of this application, all amounts are in weight percent, unless specifically referenced otherwise. Preferably, the fluorinated species has a concentration of 8 to 30 wt % of the total fluorinated species plus aliphatic fluorine-free polymer group content in the soft segment. Furthermore, the polishing pad must achieve improved performance with a polishing pad that is hydrophilic during polishing. Achieving a hydrophilic polishing pad during polishing facilitates achieving a thin and efficient pad-wafer gap for efficient polishing. Moreover, an unanticipated effect of the addition of fluorine-containing copolymers is lowering of the pad's electronegativity or zeta potential, which makes the pad surface very hydrophilic during polishing.

Figure 1:
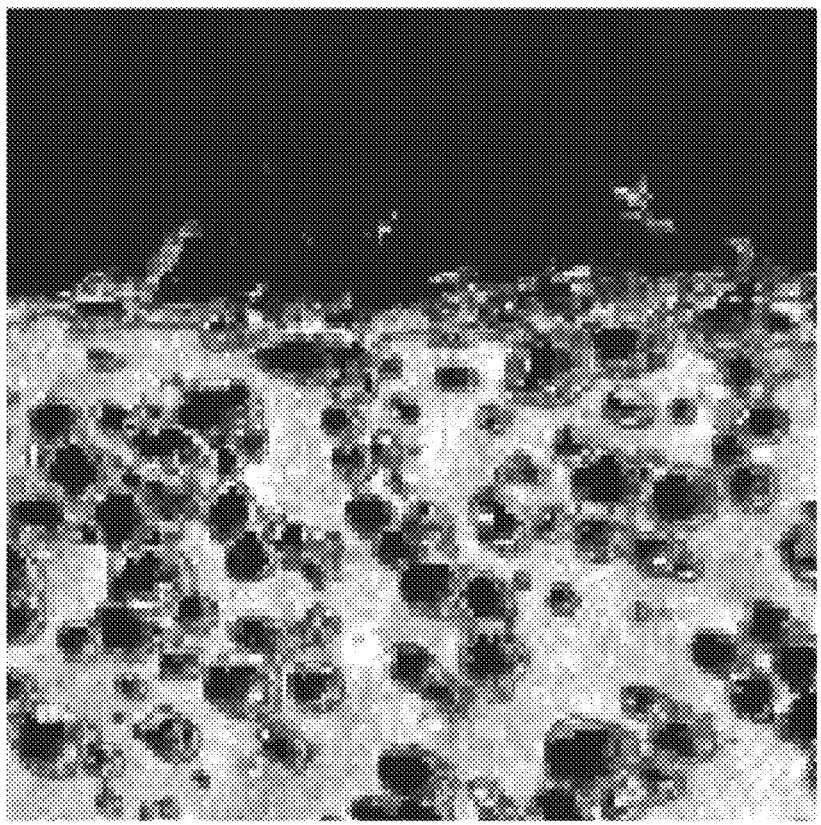
FIG. 1 is a schematic of SIMS TOF compilation of fluorine rich regions of a polishing pad of the invention converted into black and white scale with the solid black region representing a background that did not contain the polishing pad.

Given the above, an unexpected finding of the present invention is that enhanced zeta potential in water, and enhanced removal rates for slurries with cationic particles, such as $CeO_2$, can be achieved in a very low surface energy pad by selective addition of a small percentage of a fluorinated polymer segment to the soft segment of the urethane block copolymer. More specifically, as shown in FIG. 1, the addition of the fluorinated soft segment components produces significant phase separation into fluorine enriched (dark grey) and fluorine depleted domains (light grey and white). FIG. 1 shows the fluorine rich regions of higher and lower fluorine concentration surrounding the polymeric microelements. The fluorine rich areas pixelated in dark grey, however, are almost exclusively concentrated adjacent chlorine-containing polymeric microspheres pixelated in black. This migration of fluorine rich phase to the microelements forms the heterogeneous mixture microstructure of the invention. The fluorine rich phase adjacent the microspheres has a thickness of less than fifty percent of an average diameter of the polymer microelements. Also unexpected is the accumulation of fluorine rich soft phase at the polishing surface. This soft phase appears to smear and coat a large portion of the polishing surface. The bulk of the polyurea pixelated in light grey and white illustrates a fluorocarbon-containing polyurea matrix.

In the block urethane copolymer, the rigid hard segments provide stiffness, and have a high glass transition temperature (Tg). The soft segments generally have a low Tg and are more flexible at room temperature. Phase separation occurs due to the immiscibility between the hard and soft segments. In addition, biuret crosslinking groups connect some of the soft segments to the hard segments. The biuret have the formula $R_2NC(O)NR'C(O)NHR''$, where $R_2$ is the soft segment, R' includes an aromatic ring and R'' includes an aromatic ring.

The polishing pad has a polyurea polishing layer. The polyurea polishing layer includes a polyurea matrix, that includes a soft phase and a hard phase. The soft phase is formed from a soft segment having two or more aliphatic fluorine-free polymer groups and at least one fluorinated species having two end groups. Typically, the fluorinated species has a length of at least six carbon atoms. Preferably, the length of the fluorinated species is at least eight carbon atoms. Most preferably, the fluorinated species has a length of at least ten carbon atoms. The aliphatic fluorine-free polymer groups are bonded with the two end groups of the at least one fluorinated species with a nitrogen-containing linkage. Examples of nitrogen-containing linkages include urea and urethane groups. The aliphatic fluorine-free polymer groups have one end attached to the at least one fluorinated species nitrogen-containing linkage. Typically, the aliphatic fluorine-free polymer groups has a number average molecular weight between 200 and 7500. For purposes of clarity, the aliphatic fluorine-free polymer groups end before the isocyanate end groups, such as toluene diisocyanate and do not include the isocyanate end groups, nitrogen-containing linkages or the amine curative. Most preferably, the aliphatic fluorine-free polymer groups has a number average molecular weight between 250 and 5000, as measured after reaction with the amine curative. An isocyanate group caps the reaction ends of the aliphatic fluorine-free polymer groups. The soft segment forms a soft phase within the polyurea matrix. Most preferably, the aliphatic fluorine-free polymer group is a polytetramethylene ether that links with the fluorinated species. The fluorinated species may contain at least one of fluorinated ether. Preferably, the fluorinated species contains fluorinated ethylene oxide, fluorinated oxymethylene and ethylene oxide. Most preferably, the atomic ratio of fluorinated ether groups such as fluorinated ethylene oxide and fluorinated oxymethylene to ethylene oxide is less than 3.

The hard phase is formed from a diisocyanate-containing hard segment that does not contain a fluorine group and an amine-containing curative agent. The hard segment contains a urea group formed from the isocyanate group capping outer ends of the aliphatic fluorine-free polymer groups reacted with an amine-containing curative agent. Preferably, the hard segments precipitate as a hard phase within the soft phase. This morphology provides a fluorine-rich phase for improving ceria interactions and a hard phase for strengthening the soft phase to improve polishing asperity integrity for enhanced pad life and stability while polishing multiple wafers. Preferably, the hard segment and soft segment form a prepolymer before reacting the prepolymer with the amine-containing curative agent to form the polyurea matrix. The presence of fluoride moieties in the soft segment increases the soft segment glass transition temperature or Tg of the soft phase. This unexpected increase in glass transition temperature improves thermal stability of the polymer. At the very upper surface of the polymer in air, enrichment of the fluorinated soft segment components occurs during polishing. This in situ and continuous generation of fluorine rich phase at the surface further enhances the beneficial impact of a minor amount of fluoropolymer. At relatively low fluorinated soft segment concentrations (for example, below 20 wt % of the total soft segment content), the amount of fluorinated species is insufficient to prevent water molecular dipole rearrangement when the polymer is subsequently exposed to water, especially under shear. This results in a complex wetting behavior when the droplet is exposed to shear. Specifically, the water surface is believed to rearrange giving rise to increased water interaction with the hydrophilic portions of the polymer. This results in a reduction in the receding contact angle of the droplet and a corresponding increase in the surface energy during polishing. The result is that, under shear, the polishing pad of the invention can be even more hydrophilic than its fluorine-free analog.

It is widely observed that fluoropolymers such as polytetrafluoroethylene (PTFE) have a highly negative zeta potentials in water, typically greater than −20 mV, and are quite resistant to surface wetting with aqueous solutions absent a suitable wetting agent. [For purposes of this specification, zeta potential is a general term that represents potential adjacent a charged surface. Zeta potential measurements can vary widely with equipment, equipment settings and multiple other factors.] However, a potential explanation for the high negative zeta potential of PTFE is simply that it is due to the high degree of orientation of the water dipole at the polymer surface together with the low surface polarity.

For polishing pads of the invention, the liquid solid contact angle dynamic methods represent the best technique for measuring contact angle. This is because polishing is a dynamic process where the water experiences shear forces between a wafer rotating at one velocity and a polishing pad of increased diameter rotating at another velocity. The difference in diameters result in the surfaces moving in the same, opposite, partial-same and partial opposite directions. Because of the difference in velocities all polishing fluid between the wafer and the polishing pad experiences a range of shear forces. For a moving droplet, the advancing contact angle represents the degree of liquid/solid cohesion, while the receding contact angle represents the degree of liquid/solid adhesion. Generally, the advancing contact angle is measurably higher than the receding angle. The degree of difference between the two is termed the contact angle hysteresis. Contact hysteresis in surface wetting can be influenced by several factors. The major effects are caused by surface roughness (e.g., the Lotus Leaf effect), contaminants, surface heterogeneity, the degree of solvent/surface interaction (including hydrogen bonding and direct reactions), and the shear rate. Regardless of the other factors, the contact hysteresis, and, therefore, the surface energy of the solid increases directly with increasing shear rate. For the case where the surface of a set of materials are equivalent, an increase in contact hysteresis is a direct measurement of the increase in the in solvent/surface attraction (i.e., for water the surface is more hydrophilic) and correlates to the wettability as measured by the difference in surface polarization. Importantly, the polishing pads of the invention are hydrophilic as measured with the receding contact angle for increased wettability while polishing under shear conditions. In particular, the polishing layer is hydrophilic during polishing in shear conditions as indicated by a receding angle test with deionized water and methylene iodide.

The CMP polishing pads in accordance with the present invention may be made by methods comprising: providing the isocyanate terminated urethane prepolymer; providing separately the curative component; and combining the isocyanate terminated urethane prepolymer and the curative component to form a combination; to allowing the combination to react to form a product; forming a polishing layer from the product, such as by skiving the product to form a polishing layer of a desired thickness and grooving the polishing layer, such as by machining it and forming the chemical mechanical polishing pad with the polishing layer.

Pads of the present invention are polyurea block copolymers containing both hard and soft segments. The isocyanate terminated urethane prepolymer used in the formation of the polishing layer of the chemical mechanical polishing pad of the present invention preferably comprises: a reaction product of ingredients, comprising: a polyfunctional isocyanate and a prepolymer mixture containing two or more components, one of which is fluorinated.

Preferably, the isocyanate is a diisocyanate. More preferably, the polyfunctional isocyanate is a diisocyanate selected from the group consisting of 2,4-toluene diisocyanate; 2,6-toluene diisocyanate; 4,4' diphenylmethane diisocyanate; naphthalene-1,5-diisocyanate; toluidine diisocyanate; paraphenylene diisocyanate; xylylene diisocyanate; isophorone diisocyanate; hexamethylene diisocyanate; 4,4'-dicyclohexylmethane diisocyanate; cyclohexanediisocyanate; and mixtures thereof. Most preferably, the diisocyanate is toluene diisocyanate.

Optionally, the aliphatic fluorine-free polymer groups is reacted from the group consisting of diols, polyols, polyol diols, copolymers thereof, and mixtures thereof. For example, it is possible to react the aliphatic fluorine-free polymer groups with a diisocynate and then link the fluorinated species to the diisocynate. Specifically, the prepolymer polyol may be selected from the group consisting of polyether polyols (e.g., poly (oxotetramethylene) glycol, poly (oxypropylene) glycol, poly (oxyethylene) glycol); polycarbonate polyols; polyester polyols; polycaprolactone polyols; mixtures thereof; and mixtures thereof with one or more low molecular weight polyols selected from the group consisting of ethylene glycol; 1,2-propylene glycol; 1,3 propylene glycol; 1,2-butanediol; 1,3-butanediol; 2-methyl 1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and tripropylene glycol. Most preferably, the prepolymer polyol is primarily (i.e. 90 wt %) polytetramethylene ether. The fluorinated polyol can be made from any of the unfluorinated polyols cited above, added via replacement. This creates minimal variation in the final mechanical properties.

Preferably, the isocyanate terminated urethane prepolymer has an unreacted isocyanate (NCO) concentration of 8.5 to 9.5 wt %. Examples of commercially available isocyanate terminated urethane prepolymers include Imuthane™ prepolymers (available from COIM USA, Inc., such as, PET-80A, PET-85A, PET-90A, PET-93A, PET-95A, PET-60D, PET-70D, PET-75D); Adiprene™ prepolymers (available from Chemtura, such as, LF 800A, LF 900A, LF 910A, LF-930A, LF-931A, LF 939A, LF 950A, LF 952A, LF 600D, LF 601D, LF 650D, LF 667, LF 700D, LF750D, LF751D, LF752D, LF753D and L325); Andur™ prepolymers (available from Anderson Development Company, such as, 70APLF, 80APLF, 85APLF, 90APLF, 95APLF, 60DPLF, 70APLF, 75APLF).

Preferably, the isocyanate terminated urethane prepolymer is a low free isocyanate terminated urethane prepolymer having less than 0.1 wt % free toluene diisocyanate (TDI) monomer content.

The curative component used in the formation of the polishing layer of the CMP polishing pad of the present invention optionally contains a polyol curative or a polyfunctional aromatic amine curative, such as a difunctional curative. Examples of commercially available polyol curatives include Specflex™ polyols, Voranol™ polyols and Voralux™ polyols (available from The Dow Chemical Company). These multi-functional curatives all contain at least three hydroxyl groups to increase crosslinking of the polymer.

Preferably, the difunctional curative is selected from diols and diamines. More preferably, the difunctional curative used is a diamine selected from the group consisting of primary amines and secondary amines. Still more preferably, the difunctional curative used is selected from the group consisting of diethyltoluenediamine (DETDA); 3,5-dimethylthio-2,4-toluenediamine and isomers thereof; 3,5-diethyl-toluene-2,4-diamine and isomers thereof (e.g., 3,5-diethyl-toluene-2,6-diamine); 4,4'-bis-(sec-butylamino) diphenylmethane; 1,4-bis-(sec-butylamino)-benzene, 4,4' methylene-bis-(2-chloroaniline); 4,4'-methylene-bis-(3-chloro-2,6-diethylaniline) (MCDEA); polytetramethylene-oxide-di-p-aminobenzoate; N,N-dialky idiamino diphenyl methane; p,p'-methylene dianiline (MDA); m-phenylenediamine (MPDA); 4,4'-methylene-bis (2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3,3-tetrachloro diamino diphenyl methane; trimethylene glycol di-p-aminobenzoate; and mixtures thereof. Most preferably, the diamine curing agent used is selected from the group consisting of 4,4'-methylene-bis(2-chloroaniline) (MBOCA); 4,4'-methylene-bis-(3-chloro 2,6-diethylaniline) (MCDEA); and isomers thereof.

The polishing layer of the chemical mechanical polishing pad of the present invention may further contain a plurality of microelements. Preferably, the microelements are uniformly dispersed throughout the polishing layer. Preferably, the microelements are selected from entrapped gas bubbles, hollow core polymeric materials, liquid filled hollow core polymeric materials, water soluble materials and an insoluble phase material (e.g., mineral oil). More preferably, the plurality of microelements are selected from entrapped gas bubbles and hollow core polymeric materials uniformly distributed throughout the polishing layer. Preferably, the plurality of microelements have a weight average diameter of less than 150 μm (more preferably of equal to or less than 50 μm; most preferably of 10 to 50 μm). Preferably, the plurality of microelements are polymeric microballoons with shell walls of either polyacrylonitrile or a vinylidene chloride-polyacrylonitrile copolymer e.g., Expancel™ microspheres from Akzo Nobel). Preferably, the plurality of microelements is incorporated into the polishing layer to at 0 to 50 vol. % porosity (preferably 10 to 35 vol. % porosity). The vol. % of porosity is determined by dividing the difference between the specific gravity of an unfilled polishing layer and specific gravity of the microelement containing polishing layer by the specific gravity of the unfilled polishing layer.

Figure 2:
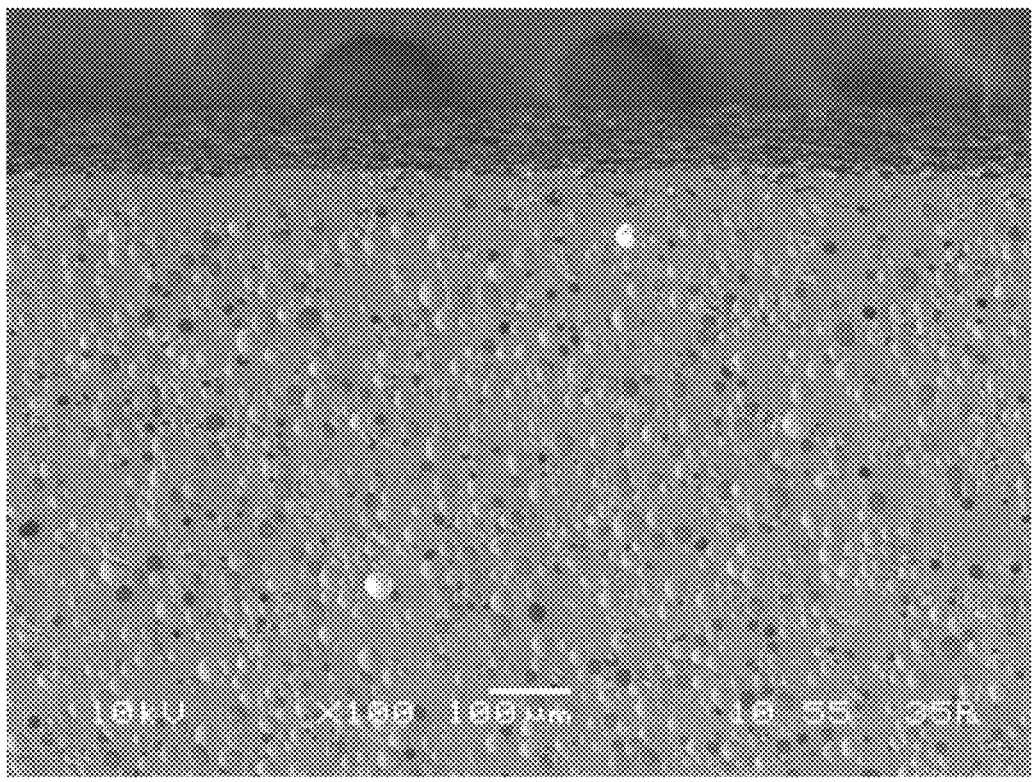
FIG. 2 is a cross-section SEM of a used polishing pad of the invention illustrating the collapse of polymeric microelements adjacent the polishing surface without puncturing from diamond conditioners.
Figure 3:
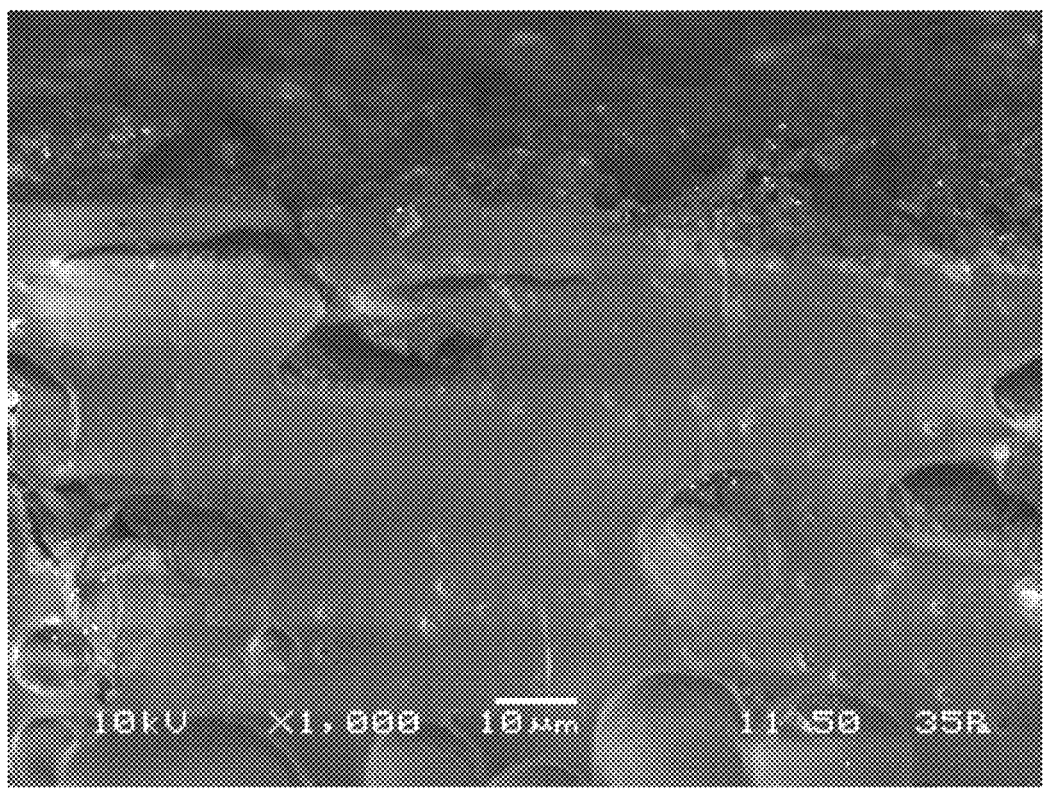
FIG. 3 is a higher magnification cross-section SEM of a used polishing pad illustrating the collapse of polymeric microelements adjacent the polishing surface without puncturing from diamond conditioners.

Referring to FIG. 2, the polymeric microelements in a transition region adjacent the polishing layer have decreased thickness as it approaches the polishing layer. Below the transition region, the polymeric microelements remain intact and unbroken as spherical microelements. These polymeric microspheres are closed cell or non-reticulated. But as polymeric microspheres near the polishing surface, they fracture and compress into smaller microelements of non-spherical shapes. The force behind this consolidation of the polymeric microspheres appears to be the compression associated with the polishing head and the conditioner before it pierces the microspheres with diamonds or another abrasive. Most all conditioning disks, however, rely upon diamonds mounted to or otherwise fixed into a metal plate. As can be seen by the surface texture being undisturbed adjacent compressed or fractured microspheres, the microspheres are not fracturing from diamond conditioning. Thus, the reason for fracture of the polymeric microspheres is independent of puncturing with diamonds from diamond conditioning. In particular, FIG. 3, at higher magnification, shows the compressed microspheres. As the polishing wears the polishing pad down, microspheres adjacent the polishing layer compress to a thickness less than their original diameter. Typically, this thickness is less than fifty percent of the original diameter; and it can be less than thirty percent of the original diameter. Another surprising feature of the invention is that compression of the polishing pad during polishing forms channels that interconnect adjacent and the polymeric microspheres being fractured at the polishing layer. This is a local phenomenon that only occurs adjacent the polishing surface. The remaining microspheres remain closed cell or intact until the pad wears a sufficient amount for the microspheres to approach the polishing surface. This appears to release fluids from inside the microspheres and allow additional compression of the microsphere before piercing of the microsphere with the diamond conditioner.

The polishing layer of the CMP polishing pad of the present invention can be provided in both porous and nonporous (i.e., unfilled) configurations. Preferably, the polishing layer of the chemical mechanical polishing pad of the present invention exhibits a density of 0.4 to 1.15 g/cm$^3$ (more preferably, 0.70 to 1.0 g/cm$^3$; as measured according to ASTM D1622 (2014)).

Preferably, the polishing layer of the chemical mechanical polishing pad of the present invention exhibits a Shore D hardness of 28 to 75 as measured according to ASTM D2240 (2015).

Preferably, the polishing layer has an average thickness of 20 to 150 mils (0.05 to 0.4 cm). More preferably, the polishing layer has an average thickness of 30 to 125 mils (0.08 to 0.3 cm). Still more preferably, the polishing layer has an average thickness of 40 to 120 mils (0.1 to 0.3 cm); most preferably, 50 to 100 mils (0.13 to 0.25 cm).

Preferably, the CMP polishing pad of the present invention is adapted to be interfaced with a platen of a polishing machine. Preferably, the CMP polishing pad is adapted to be affixed to the platen of a polishing machine. Preferably, the CMP polishing pad can be affixed to the platen using at least one of a pressure sensitive adhesive and vacuum.

The CMP polishing pad of the present invention optionally further comprises at least one additional layer interfaced with the polishing layer. Preferably, the CMP polishing pad optionally further comprises a compressible base layer adhered to the polishing layer. The compressible base layer preferably improves conformance of the polishing layer to the surface of the substrate being polished.

The CMP polishing pad of the present invention in its final form further comprises the incorporation of texture of one or more dimensions on its upper surface. These may be classified by their size into macrotexture or microtexture. Common types of macrotexture employed for CMP control hydrodynamic response and slurry transport, and include, without limitation, grooves of many configurations and designs, such as annular, radial, biased radial and cross-hatchings. These may be formed via machining processes to a thin uniform sheet or may be directly formed on the pad surface via a net shape molding process. Common types of microtexture are finer scale features that create a population of surface asperities that are the points of contact with the substrate wafer where polishing occurs. Common types of microtexture include, without limitation, texture formed by abrasion with an array of hard particles, such as diamond (often referred to as pad conditioning), either prior to, during or after use, and microtexture formed during the pad fabrication process.

Figure 4:
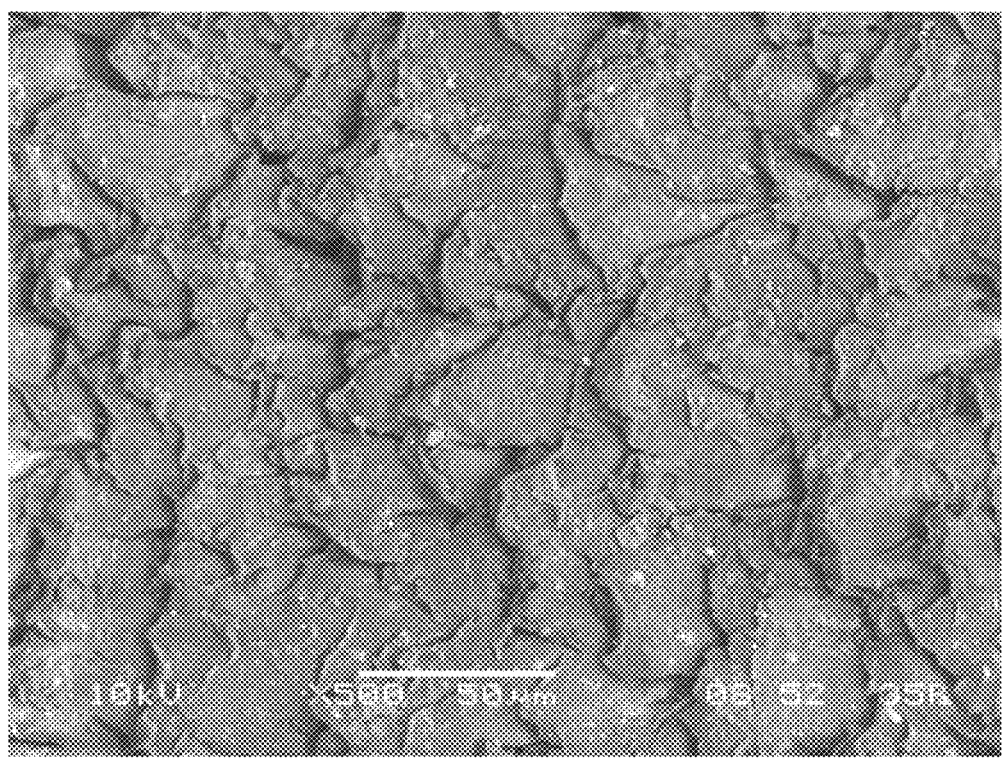
FIG. 4 is a cross-section SEM of a used polishing pad illustrating the formation of a denticle-like polishing surface.

As seen in FIG. 4, denticle-like polishing surface analogous to shark skin can form during diamond conditioning. This microtexture is extremely fine and can further facilitate improved polishing removal rates. This impact is especially pronounced when polishing with cationic particles, such as ceria particles.

An important step in substrate polishing operations is determining an endpoint to the process. One popular in situ method for endpoint detection involves providing a polishing pad with a window, which is transparent to select wavelengths of light. During polishing, a light beam is directed through the window to the substrate surface, where it reflects and passes back through the window to a detector (e.g., a spectrophotometer). Based on the return signal, properties of the substrate surface (e.g., the thickness of films thereon) can be determined for endpoint detection purposes. To facilitate such light-based endpoint methods, the chemical mechanical polishing pad of the present invention, optionally further comprises an endpoint detection window. Preferably, the endpoint detection window is selected from an integral window incorporated into the polishing layer; and a plug-in place endpoint detection window block incorporated into the chemical mechanical polishing pad. For unfilled pads of the present invention that have sufficient transmittance, the upper pad layer itself can be used as the window aperture. Since pads of the present invention exhibit phase separation, a transparent region of the top pad material can also be produced by locally increasing the cooling rate during fabrication to locally inhibit phase separation, resulting in a more transparent region suitable for use as the endpointing window.

CMP polishing pads are used in conjunction with a polishing slurry, as described in the background of the invention. CMP polishing pads of the present invention are designed for use with slurries whose pH is below the isoelectric point pH of the particle being used. For example, $CeO_2$ has an isoelectric pH of approximately 6.6. Below this pH, the particle surface has a net positive charge. Above this pH, the particle has a net negative charge. Since pads of the present invention exhibit a high negative charge at that pH, the rate enhancement is achieved when the particles are below the isoelectric point.

The CMP pads of the present invention may be manufactured by a variety of processes that are compatible with thermoset urethanes. These include mixing the ingredients as described above and casting into a mold, annealed, and sliced into sheets of the desired thickness. Alternatively, they may be made in a more precise net shape form. Preferred processes in accordance with the present invention include the following: 1. thermoset injection molding (often referred to as "reaction injection molding" or "RIM"); 2. thermoplastic or thermoset injection blow molding; 3.compression molding; or 4. any similar-type process in which a flowable material is positioned and solidified, thereby creating at least a portion of a pad's macrotexture or microtexture. In a preferred molding embodiment of the present invention: 1. the flowable material is forced into or onto a structure or substrate; 2. the structure or substrate imparts a surface texture into the material as it solidifies, and 3. the structure or substrate is thereafter separated from the solidified material.

Some embodiments of the present invention are described in detail in the following examples.

EXAMPLES

Pad samples used in the examples were prepared as follows:
Materials
PTMEG was a blend of various PTMEGs having a molecular weight ranging from 250 to 2000 from Invista. 4,4'-Dicyclohexylmethane diisocyanate/toluene diisocyanate ("$H_{12}MDI/TDI$") PTMEG was Adiprene™ L325 prepolymer having an NCO of 8.95 to 9.25 wt % from Lanxess. TDI was obtained as Voranate™ T-80 from Dow. The polymeric microspheres were Expancel™ vinylidene chloride-polyacrylonitrile copolymer microspheres, having an average particle diameter of about 20 μm. The fluoropolymer was a ethoxylated perfluoroether. The fluoropolymer had a linear structure of fluorinated ethylene oxide-fluorinated oxymethylene capped with ethylene oxide. The atomic ratio "R" of fluorinated ether to ethylene oxide was either 1.9 or 5.3.

Synthesis of Prepolymers

Prepolymers were synthesized in batches ranging from approximately 200 to 1000 gram Ethoxylated perfluoroether was added by replacing a portion of the PTME2000 component of the prepolymer to produce varying levels of fluorinated polytetramethyl ether. TDI and $H_{12}$MDI were mixed at 80:20 weight ratio before adding to the mixture. Enough isocyanate mixture was then added to the mixture to achieve the desired NCO wt %. The whole mixture was again mixed and then placed in a pre-heated oven at 65° C. for 4 hours before use. All samples were tested the same day as synthesis.

Pad Production

The synthesized prepolymers and 4,4'-Dicyclohexylmethane diisocyanate/toluene diisocyanate ("$H_{12}$MDI/TDI") polytetramethylene ether were heated to 65° C. MBOCA was pre-weighted and melted in oven at 110° C. Polymeric microspheres were added to the prepolymers after the 4 hour reaction time or once heated and degassed with polymeric microspheres in prepolymer via vacuum. All filled samples included a distribution of polymeric microspheres sufficient to reach either a specific gravity or final density. After degassing and once both components were at temperature, the MBOCA was added to the prepolymer and mixed. After mixing, the sample was poured onto a heated plate and drawn using a Teflon™ coated bar with a spacer set at 175 mil (4.4 mm). The plate was then transferred into an oven and heated to 104° C. and held at temperature for 16 hours. The drawdown was then demolded and punched down to 22" (55.9 cm) and used to prepare a laminated pad for polishing. All pads were 20" (50.8 cm) in diameter with an 80 mil (2.0 mm) top pad, 1010 circular grooving having a width, depth and pitch of 20 mils, 30 mils, and 120 mils (0.51 mm, 0.76 mm and 3.05 mm), respectively, pressure sensitive adhesive film for the subpad, Suba IV™ polyurethane impregnated polyester felt subpad, and pressure sensitive platen adhesive. Plaques of each material set were also made into plaques for property testing both with and without the polymeric microsphere filler for property testing.

A reference table of the samples cited in the following examples is given in Table 1. The fluoropolymer content was expressed as the percent substitution for the PTMEG content in the comparative being a mixture of polyether-based-toluene diisocyanate terminated liquid prepolymer having an NCO of 8.9 to 9.3 wt % cured with 4,4'-methylene-bis (2-chloroaniline) at a stoichiometry measured as NCO to curative amine of 105%. For purposes of this specification, stoichiometry represents the molecular ratio of NCO to amine.

TABLE 1

| Sample | Ethoxylated Perfluoroether (Wt. %) |
|---|---|
| A | 0 |
| 1 | 6 |
| 2 | 12 |
| 3 | 18 |
| 4 | 24 |

Example 1

Samples of a polyurea formulation were made with varying degrees of fluorinated substitution. Comparative A was the fluorine-free parent material; while samples 1 and 2 were produced with 6 wt % and 12 wt % substitution of the polytetramethylene ether component by the fluorinated species. The plaque samples produced without filler showed a significant reduction in transparency for both levels of fluoropolymer content, indicating a higher degree of phase separation. Furthermore, FTIR analysis indicated the presence of a biuret with a peak at 1535 $cm^{-1}$.

Material property summaries for the three materials are given in Table 2. Property differences at substitution levels of 12 wt % or less were relatively minor. At higher substitution levels, however, the pads became increasingly brittle. The functional limit for the reduction in elongation and toughness without undesirable effects on the polishing process was estimated to occur at approximately 20 wt % substitution.

TABLE 2

| Sample | Ethoxylated Perfluoroether wt % | Density (g/cm³) | Duronneter Hardness (MPa) | Median Tensile Strength | Median Elongation (%) | Median Modulus (MPa) | Toughness (MPa) |
|---|---|---|---|---|---|---|---|
| A | 0% | 0.93 | 64D | 24.4 | 166 | 334.4 | 37.8 |
| 1 | 6% | 0.96 | 65D | 32.4 | 198 | 417.4 | 57.9 |
| 2 | 12% | 0.91 | 65D | 32.0 | 138 | 459.6 | 41.9 |
| 3 | 18% | 1.01 | 66D | 30.3 | 77 | 403.8 | 21.6 |
| 4 | 24% | 1.01 | 68D | 32.0 | 55 | 458.9 | 15.7 |

NOTE: Samples 1 to 4 had a perfluoroether/ethylene oxide atomic ratio of ~1.9

Example 2

Pads of the useful range were examined for surface properties relative to the fluorine-free parent. Properties measured were both static and dynamic contact angle measurements to derive surface energies. Both sets of measurements used the plaque samples to assure measurements on a smooth as-cast surface. This avoided measurement errors due to surface roughness. This is most critical for measurement of surface energy.

Surface energy measurements were performed via sessile drop goniometry using a commercial apparatus manufactured by Kruss. Measurements were performed using deionized water and diiodomethane ("methylene iodide"). The two-component Fowkes method was used to derive surface energy values from the mean contact angles measured. Both static and dynamic measurements were performed to derive the equilibrium, advancing, and receding surface energies.

Dynamic Contact Angle

TABLE 3

| Sample | Minimum Surface Energy (calculated from advancing angle) (dyne/cm) | | | Maximum Surface Energy (calculated from receding angle) (dyne/cm) | | |
|---|---|---|---|---|---|---|
| | $\gamma_s^d$ | $\gamma_s^p$ | $\gamma_s^{total}$ | yd | YsP | ystotal |
| A | 28.8 | 1.0 | 29.8 | 50.8 | 16.7 | 67.5 |
| 2 | 11.1 | 1.9 | 13.0 | 46.5 | 15.7 | 62.2 |
| 3 | 11.5 | 1.4 | 12.9 | 47.4 | 13.3 | 60.7 |

The comparative pad control pad became hydrophilic under dynamic conditions, assuming contact angle of 0 (completely wetting with methylene iodide). Surprisingly, data show that Samples 2 and 3 with large amounts of fluoropolymer and high electronegativity, also are hydrophilic under dynamic conditions. This test verified that the polishing pad was hydrophilic during polishing.

Example 3

A pad of the current invention with different specific gravity, as well as a second mixture of polyether-based-toluene diisocyanate terminated liquid prepolymer having an NCO of 8.9 to 9.3 wt % cured with 4,4'-methylene-bis (2-chloroaniline) at a stoichiometry measured as NCO to curative amine of 105% ("Comparative Sample B"), were used to polish TEOS wafers using two slurries.

The first slurry was a commercially available ceria slurry (Asahi CES333F) prepared using manufacturer's instructions. The pH during use was 5.5. Based on previous data, the use pH is well below the isoelectric pH of the ceria particle being used. The second slurry was a commercially available silica slurry (Cabot SS25), also prepared using manufacturer's instructions. The pH during use was 10.5. Based on previous data presented, the use pH was well above the isoelectric pH of the silica particle being used.

Each pad was used to polish wafers over a range of applied pressure using the same conditions to allow an estimation of the differences in Preston Coefficient, as measured by the slope of the pressure vs. rate response. Polishing conditions used for each test were 93 rpm platen speed, 87 rpm wafer carrier speed, and 200 ml/min slurry flow. The polishing equipment used was an Applied Materials Mirra™ tool.

Figure 5:
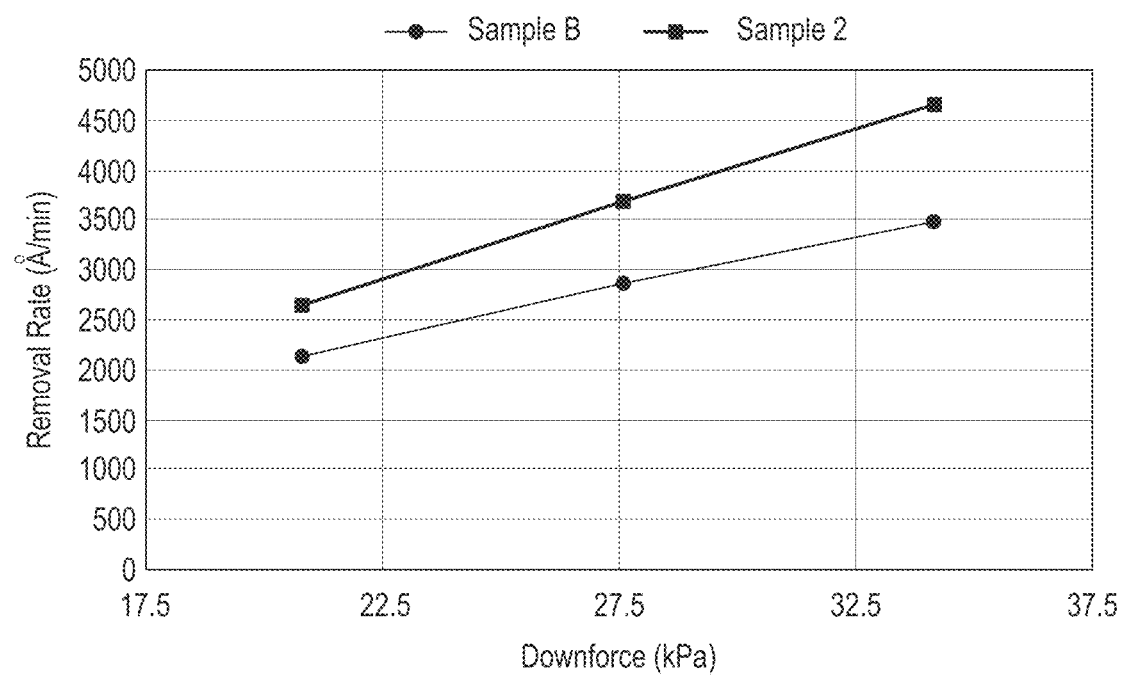
FIG. 5 illustrates comparative ceria slurry polishing test of a pad of the present invention versus a pad made from a fluoropolymer-free parent formulation.

As shown in Table 4 and FIG. 5, significant enhancement in polishing rate was observed for the pad of the present invention over the entire range of downforce when polishing with cationic ceria particles. The invention provided an 20 to 30 percent increase in removal rate was observed depending on downforce. The slope of the pressure/rate response, which was a measure of the Preston Coefficient contribution from the pad, was at least 60% higher than that of the parent pad.

TABLE 4

| | | Removal Rate | | |
|---|---|---|---|---|
| Sample | SG (g/cm³) | Downforce: 3 (psi)/20.7 (kPa) (Å/min) | Downforce: 4( psi)/27.6 (kPa) (Å/min) | Downforce: 5 (psi)/34.5 (kPa) Å/min |
| B | 0.95 | 2141 | 2870 | 3479 |
| 2 | 0.95 | 2653 | 3685 | 4654 |

Figure 6:
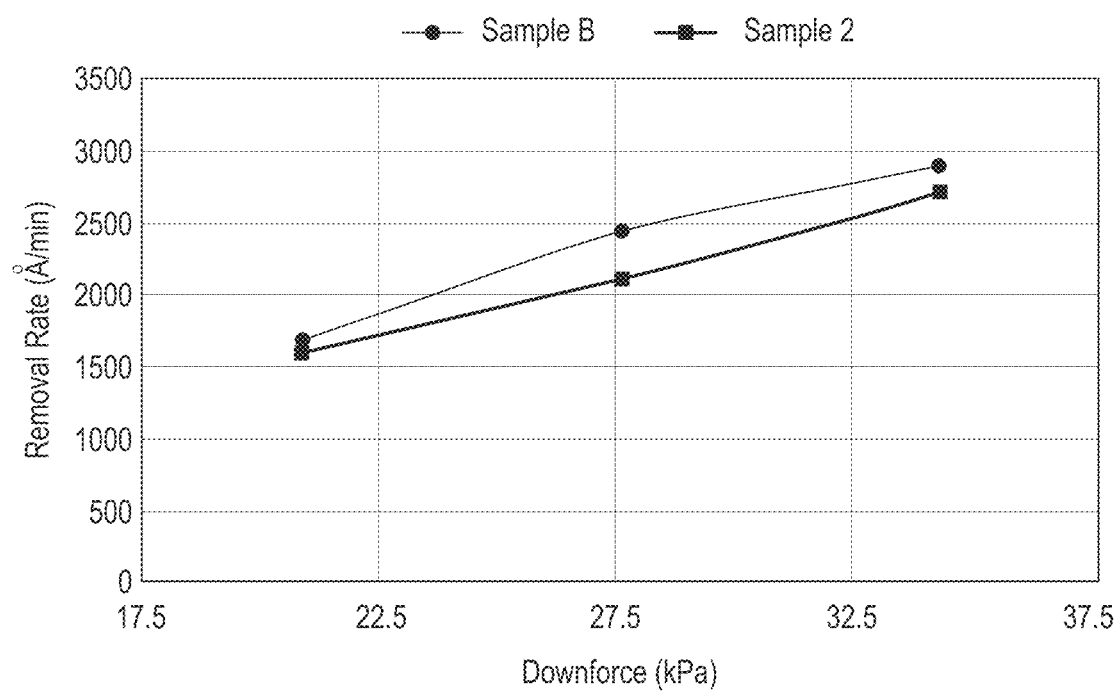
FIG. 6 illustrates comparative silica slurry polishing test of a pad of the present invention versus a pad made from a fluoropolymer-free parent formulation.

In contrast, there was lower rate for both fluorine-containing samples over the entire range of downforce, as shown in Table 5 and FIG. 6 with anionic silica particles. In addition, the slope of the pressure/rate response, which is a measure of the difference in the Preston Coefficient contribution from the pad, was significantly higher for the parent pad by about 10%.

TABLE 5

| | | Removal Rate | | |
|---|---|---|---|---|
| Sample | SG (g/cm³) | Downforce: 3 (psi)/20.7 (kPa) (Å/min) | Downforce: 4 (psi)/27.6 (kPa) (Å/min) | Downforce: 5 (psi)/34.5 (kPa) Å/min |
| B | 0.80 | 1684 | 2449 | 2895 |
| 2 | 0.80 | 1602 | 2116 | 2707 |

Total defect post polish were measured at 3 psi (20.7 kPa) for both polishing experiments shown above. The ceria polish was measured post HF application and the silica polish used EKC 5650 cleaning solution. The results are shown in Table 6. The fluorinated formulation demonstrated reduced total defects while polishing with ceria which the opposite effect is observed when using colloidal silica.

TABLE 6

| Sample | Slurry | Post Polish Total Defects (#) |
|---|---|---|
| B | Asahi CES333 | 635 |
| 2 | Asahi CES333 | 470 |
| B | SS25 | 16012 |
| 2 | SS25 | 22017 |

Note:
Total defects vary considerably with polishing process, slurry, measuring technique and settings. Total defects were determined from polished wafer cleaned using Lam Ontrak Synergy™ cleaner using DuPont™ EKC PCMP5650™ cleaning chemistry (1:90 dilution). Post cleaned wafer measured on KLA/TENCOR Surfscan® SP2 un-patterned wafer defect inspection system using defect size >0.16 um. Defect data analyzed using KLA/TENCOR Klarity® software.

Example 4

Two versions of the above-specified molecule were used with n values of 1.5 (Fluorinated species MW~1800 g/mol) and n>4 (Fluorinated species, MW~2000 g/mol). Larger n value will lead to increased compatibility of the fluorinated segments were used in soft segment ureas. To evaluate effects on polishing a control prepolymer was made of the following polyurea formulation.

TABLE 7

| Sample | PTME250/PTME650/ PTME1000/ PTME2000 (wt %) | Isocyanate | NCO (wt %) |
|---|---|---|---|
| B | 29/22.2/24.9/23.9 | TDI/H12MDI (80/20 wt ratio) | 9.15 |

PTME = polytetramethylene ether (molecular weight)

Comparison prepolymers were made replacing a portion of the PTMEG2000 component with the ethoxylated perfluoroethers as below:

TABLE 8

| Sample | R | PTME250/PTME650/ PTME1000/ PTME2000/ethoxylated perfluoroether (wt %) | NCO (wt %) | Phase after reaction |
|---|---|---|---|---|
| 5 | ~1.9 | 29/22.2/24.9/11.95/11.95 | 9.15 | Liquid |
| 6 | ~1.9 | 29/22.2/24.9/17.95/5.98 | 9.15 | Liquid |
| 7 | 5.3 | 29/22.2/24.9/11.95/11.95 | 9.15 | Solid |
| 8 | 5.3 | 29/22.2/24.9/17.95/5.98 | 9.15 | Liquid |

PTME = polytetramethylene ether (molecular weight)

The prepolymer using perfluoroether/ethylene oxide atomic ratio of 1.9 had higher compatibility and was able to be used to make a viable prepolymer at both concentrations, while the perfluoroether/ethylene oxide atomic ratio of 5.3 was only viable at the lower concentration due to prepolymer viscosity rise and solidification resulting from excessive phase separation. Solidification of the prepolymer made it unsuitable for casting with a curative into a polyurea polishing pad.

Pads were cast from the viable formulations using MBOCA as the curative at 105% stoichiometry. The removal rate results as a function of downforce are shown below. As seen in the chart, the fluorinated prepolymer samples all enhanced removal rate over the unfluorinated control, however, due to the enhanced compatibility and higher achievable concentration of the ethoxylated perfluoroether, the removal rate was further enhanced in sample 5 over samples 6 and 8.

The estimated perfluoroether/ethylene oxide atomic ratio for the 3 ethylene oxide fluoropolymer for Samples 7 and 8 was determined to be 5.3. For the ~8, perfluoroether/ethylene oxide atomic ratio for samples 5 and 6 was approximately 1.9. For improved casting and soft segment segregation the perfluoroether/ethylene oxide atomic ratio is preferably less than 4. More preferably, the ratio is less than 3 and most preferably, it is less than 2.5 Alternatively, surfactants can improve the solubility of the high perfluoroether/ethylene oxide atomic ratio formulations. However, these formulations do not always provide additional removal rate improvements with the increased fluoropolymer.

Table 9 below provides ceria polishing rates when using the ceria slurry of Example 3 with the prepolymers cast as pads as described above.

TABLE 9

| | Downforce (psi)/(kPa) | | | |
|---|---|---|---|---|
| | 2/13.8 | 3/20.7 | 4/27.6 | 5/34.5 |
| Sample B (Å/min) | 3037 | 4649 | 5838 | 6851 |
| Sample 6 (Å/min) | 3171 | 5161 | 6928 | 8085 |
| Sample 8 (Å/min) | 3216 | 5020 | 6964 | 7975 |
| Sample 5 (Å/min) | 3547 | 5816 | 7841 | 9545 |

As can be seen from Table 9, the fluoropolymer additive provides increased removal rates at higher downforces when using modified ceria slurry Hitachi HS-08005A diluted 1:9 at a pH of 8.35.

Sample 7 prepolymer could be made by adding 0.5 wt % of Merpol A alcohol phosphate surfactant of the total prepolymer into the mixture before reaction. This allowed for it to be used in casting of a pad sample. However, no further improvement was observed by increasing the atomic ratio R to 5.3 with surfactant unlike the one observed with the atomic ratio R of 1.9 as seen by comparing it to Sample 5 above.

TABLE 10

| | Downforce (psi)/(kPa) | | | |
|---|---|---|---|---|
| | 2/13.8 | 3/20.7 | 4/27.6 | 5/34.5 |
| Sample 7 (Å/min) | 3052 | 4958 | 6931 | 8068 |

Note:
The Table 10 polishing data were from the same ceria-modified slurry as that used in Table 9.

The polyurea end capped fluoropolymer of the invention provides an unexpected increase in dielectric removal rate when polishing with ceria-containing slurries at acidic pH levels or a modified ceria-containing alkaline slurry. Furthermore, the fluorine rich phase accumulates near microspheres to form a heterogeneous mixture microstructure. In addition, the fluorine rich phase accumulates near the surface to improve polishing rate. Finally, the microsphere near the surface can compress and flatten to formation of a polishing layer having a denticle-like microtexture.

We claim:

1. A polishing pad suitable for polishing at least one of semiconductor, optical, magnetic or electromechanical substrates comprising:
    a polyurea polishing layer, the polyurea polishing layer including a polyurea matrix, the polyurea having a soft segment and a hard segment, the soft segment being a copolymer of aliphatic fluorine-free polymer groups and a fluorocarbon having a length of a least six carbons, the polyurea matrix being cured with a curative agent and including gas or liquid-filled polymeric microelements, the polyurea matrix being having a bulk region, a transition region adjacent the bulk region that extends to the polishing layer, the polymeric microelements having a diameter and being spherical in the bulk region of the polyurea matrix, the polymeric microelements in the transition region having decreased thickness as it approaches the polishing layer with thickness of the compressed microelements adjacent the polishing layer being less than fifty percent of the diameter of the polymeric microelements in the bulk region and the polymeric microspheres being fractured at the polishing layer during polishing wherein the polishing layer remains hydrophilic during polishing in shear conditions.

2. The polishing pad of claim 1 wherein the fluorine rich region produces regions of higher and lower fluorine concentration surrounding the polymeric microelements.

3. The polishing pad of claim 1 wherein the fluorine rich phase has an average thickness of less than fifty percent of an average diameter of the polyurea microelements.

4. The polishing pad of claim 1 wherein the polymeric microelements fracture under compression adjacent the polishing slurring independent of diamond conditioning.

5. The polishing pad of claim 1 wherein the polishing layer can form a surface containing denticle-like structures during polishing.

6. A polishing pad suitable for polishing at least one of semiconductor, optical, magnetic or electromechanical substrates comprising:
    a polyurea polishing layer, the polyurea polishing layer including a polyurea matrix, the polyurea having a soft segment and a hard segment, the soft segment being a copolymer of aliphatic fluorine-free polymer groups and a fluorocarbon having a length of a least six carbons, the polyurea matrix being cured with a curative agent and including gas or liquid-filled polymeric microelements, the polyurea matrix being having a bulk region, a transition region adjacent the bulk region that extends to the polishing layer, the polymeric microelements having a diameter and being spherical in the bulk region of the polyurea matrix, the polymeric microelements in the transition region having decreased thickness as it approaches the polishing layer with thickness of the compressed microelements adjacent the polishing layer being less than fifty percent of the diameter of the polymeric microelements in the bulk region wherein at least of a portion of the polymeric microelements adjacent the polishing layer form channels that interconnect adjacent and the polymeric microspheres being fractured at the polishing layer during polishing wherein the polishing layer remains hydrophilic during polishing in shear conditions.

7. The polishing pad of claim 6 wherein the fluorine rich region produces regions of higher and lower fluorine concentration surrounding the polymeric microelements.

8. The polishing pad of claim 6 wherein the fluorine rich phase has an average thickness of less than fifty percent of an average diameter of the polyurea microelements.

9. The polishing pad of claim 6 wherein the polymeric microelements fracture under compression adjacent the polishing slurring independent of diamond conditioning.

10. The polishing pad of claim 6 wherein the polishing layer can form a surface containing denticle-like structures during polishing.

* * * * *